(12) United States Patent
Tran

(10) Patent No.: US 8,445,773 B2
(45) Date of Patent: May 21, 2013

(54) THERMOELECTRIC GENERATOR

(75) Inventor: Thanh Nhon Tran, Chantilly, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 598 days.

(21) Appl. No.: 12/712,385

(22) Filed: Feb. 25, 2010

(65) Prior Publication Data

US 2010/0212712 A1   Aug. 26, 2010

Related U.S. Application Data

(60) Provisional application No. 61/155,168, filed on Feb. 25, 2009.

(51) Int. Cl.
| H01L 35/00 | (2006.01) |
| H01L 37/00 | (2006.01) |
| H01L 35/28 | (2006.01) |
| B32B 3/12 | (2006.01) |
| B21D 39/00 | (2006.01) |

(52) U.S. Cl.
USPC ........... 136/205; 136/206; 136/207; 136/211; 136/212; 428/116; 428/117; 428/593; 502/527.19

(58) Field of Classification Search
USPC ................. 136/206, 207, 211, 212; 428/116, 428/117, 593; 502/527.19
See application file for complete search history.

(56) References Cited

U.S. PATENT DOCUMENTS

| 3,303,361 A | 2/1967 | Martini |
| 3,423,249 A * | 1/1969 | Ross et al. .................... 136/212 |
| 3,677,822 A | 7/1972 | Bush |
| 3,898,101 A | 8/1975 | Bush et al. |
| 4,158,084 A | 6/1979 | Prentice |
| 4,349,612 A | 9/1982 | Baldi |
| 4,649,895 A | 3/1987 | Yasuki et al. |
| 4,815,384 A | 3/1989 | Dillard et al. |
| 5,611,329 A | 3/1997 | Lamensdorf |
| 5,622,672 A | 4/1997 | Swick et al. |
| 5,625,245 A | 4/1997 | Bass |
| 5,892,656 A | 4/1999 | Bass |
| 5,917,144 A * | 6/1999 | Miyake et al. ................ 136/205 |
| 5,918,590 A | 7/1999 | Burkett et al. |
| 6,187,123 B1 | 2/2001 | Chenier et al. |
| 6,307,142 B1 | 10/2001 | Allen et al. |

(Continued)

FOREIGN PATENT DOCUMENTS

| EP | 1 101 910 A2 | 5/2001 |
| EP | 1101910 A2 * | 5/2001 |
| JP | 2001 065858 A | 3/2001 |

OTHER PUBLICATIONS

JP 2001 0655858 A Ishikawajima Harima Heavy IND, European Patent Office, Patent Abstracts of Japan.

*Primary Examiner* — Miriam Berdichevsky
*Assistant Examiner* — Mayla Gonzalez Ramos
(74) *Attorney, Agent, or Firm* — Richard A. Morgan

(57) ABSTRACT

A thermoelectric generator has a hot side heat exchanger having a silicon carbide (SiC) honeycomb support with a plurality of passages. The passage walls are coated with a pyrophoric solid fuel such as red oxide ($Fe_2O_3$) in combination with a silicon (Si) binder. A quantum well thermoelectric device is positioned between the hot side heat exchanger and heat sink. The performance of the thermoelectric generator is comparable to fuel cells. The thermoelectric generator is small and portable.

12 Claims, 4 Drawing Sheets

U.S. PATENT DOCUMENTS

| | | |
|---|---|---|
| 6,336,935 B1 | 1/2002 | Davis et al. |
| 6,527,548 B1 | 3/2003 | Kushch |
| 6,596,666 B1 | 7/2003 | Yamada |
| 2003/0217766 A1* | 11/2003 | Schroeder et al. ............ 136/230 |
| 2005/0172992 A1 | 8/2005 | Shimoji et al. |
| 2008/0223427 A1* | 9/2008 | Ohno ............................ 136/238 |
| 2009/0071526 A1* | 3/2009 | Parker .......................... 136/205 |

* cited by examiner

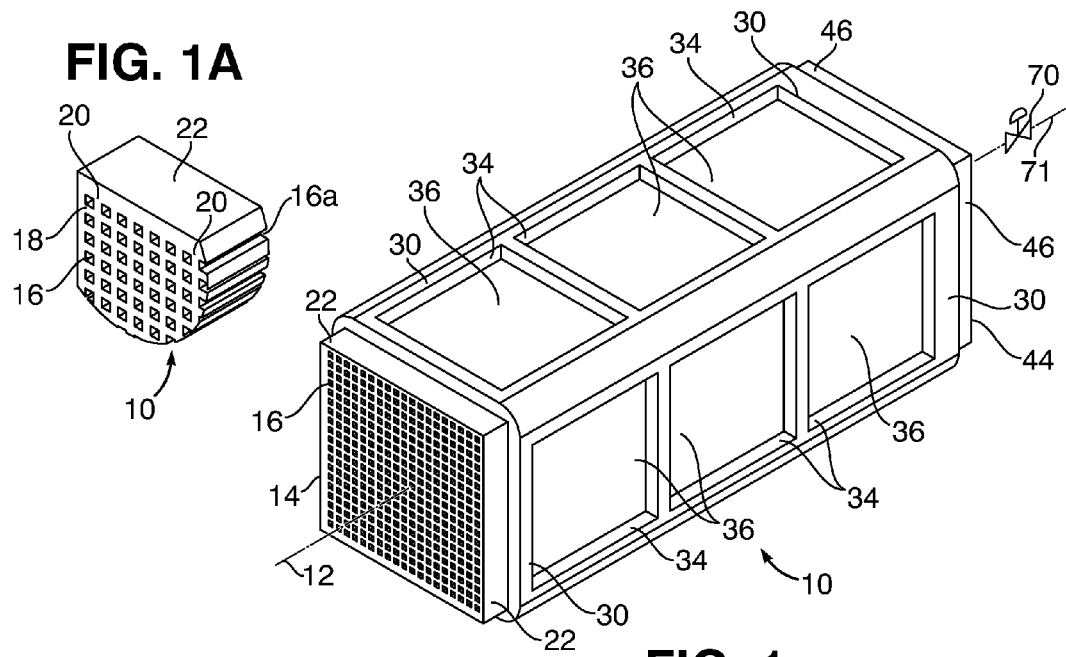
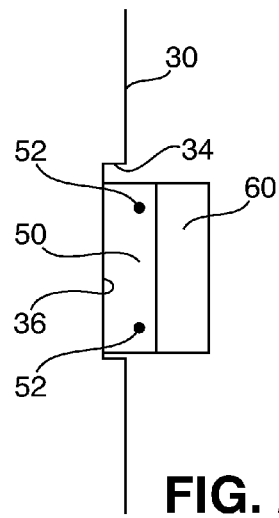

THERMOELECTRIC GENERATOR

CROSS-REFERENCE TO RELATED APPLICATION

This application claims priority from U.S. Provisional Patent Application No. 61/155,168 filed Feb. 25, 2009, for a Thermoelectric Generator, the disclosure of which is incorporated herein by reference in its entirety.

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

1. Field of the Invention

The invention relates to a thermoelectric generator. More particularly, the invention relates to a thermoelectric generator with a heat source structure, a heat sink and thermoelectric module there between. The invention relates to a thermoelectric generator with a heat source having a fuel composition on a shaped support.

2. Discussion of the Related Art

Thermoelectric power (TE) generation is a solid-state process that converts heat to electricity. At the present stage of development of the process, the conversion of a heat producing fuel to electricity is relatively low. However, the process has desirable characteristics including the absence of moving parts or vibration, silence and ruggedness. For these reasons, the process has potential for replacing batteries in certain applications. These applications include military, space and civilian emergency applications where performance is of primary importance and cost is of lesser concern.

The electric power output of a thermoelectric generator is a function of the temperature difference across the thermoelectric device and the heat to power conversion efficiency of the thermoelectric device material. Thermoelectric efficiency of a material is measured by a figure of merit, Z. The figure of merit is specific to each material and can be calculated according to the formula:

$$Z = S^2 \rho / K$$

where:
S is the Seebeck coefficient,
ρ is the electrical conductivity, and
K is the thermal conductivity.

Figure of merit has been found to vary with temperature. Therefore the term ZT is often used. ZT is the figure of merit Z at a specified temperature T.

The Seebeck coefficient is defined as the ratio of the open-circuit voltage to the temperature difference between the hot and cold junctions of a circuit exhibiting the Seebeck effect. This is expressed as:

$$S = V/(T_h - T_c)$$

where:
V is the open-circuit voltage,
$T_h$ is the hot junction temperature, and
$T_c$ is the cold junction temperature.

η is the efficiency of a device in converting heat to electricity. It is related to the figure of merit and the Seebeck coefficient by the equation:

$$\eta = \frac{T_h - T_c}{T_h} \frac{(1 + ZT_{avg})^{0.5} - 1}{(1 + ZT_{avg})^{0.5} + T_c/T_h}$$

where:
$ZT_{avg}$ is the above described coefficient Z at a specific temperature $T_{avg}$,
$T_h$ is the hot junction temperature,
$T_c$ is the cold junction temperature, and
$T_{avg}$ is the average of $T_h$ and T.

There is a need in the art for a thermoelectric generator that produces power at conventional battery voltages, is lighter than an power equivalent batteries, produces power longer than batteries and has an extended shelf life.

SUMMARY OF THE INVENTION

A thermoelectric generator comprises: a hot side heat exchanger, a cold side heat exchanger, and a thermoelectric device between the hot side heat exchanger and the cold side heat exchanger.

The hot side heat exchanger comprises a honeycomb shaped support having a plurality of axially aligned passages. The passages are defined by partition walls. The partition walls are coated with a pyrophoric solid fuel.

A thermoelectric generator including the hot side heat exchanger produces electric current on contact of the pyrophoric fuel with air. In the absence of air, the generator has a shelf life much longer than the shelf life of batteries.

BRIEF DESCRIPTION OF THE DRAWING

FIG. 1 is a perspective view of a hot side heat exchanger.

FIG. 1a is a sectional exploded view of a portion of a hot side heat exchanger core.

FIG. 2 is schematic cross sectional view of a portion of a thermoelectric generator.

DETAILED DESCRIPTION OF THE INVENTION

Figure 3:
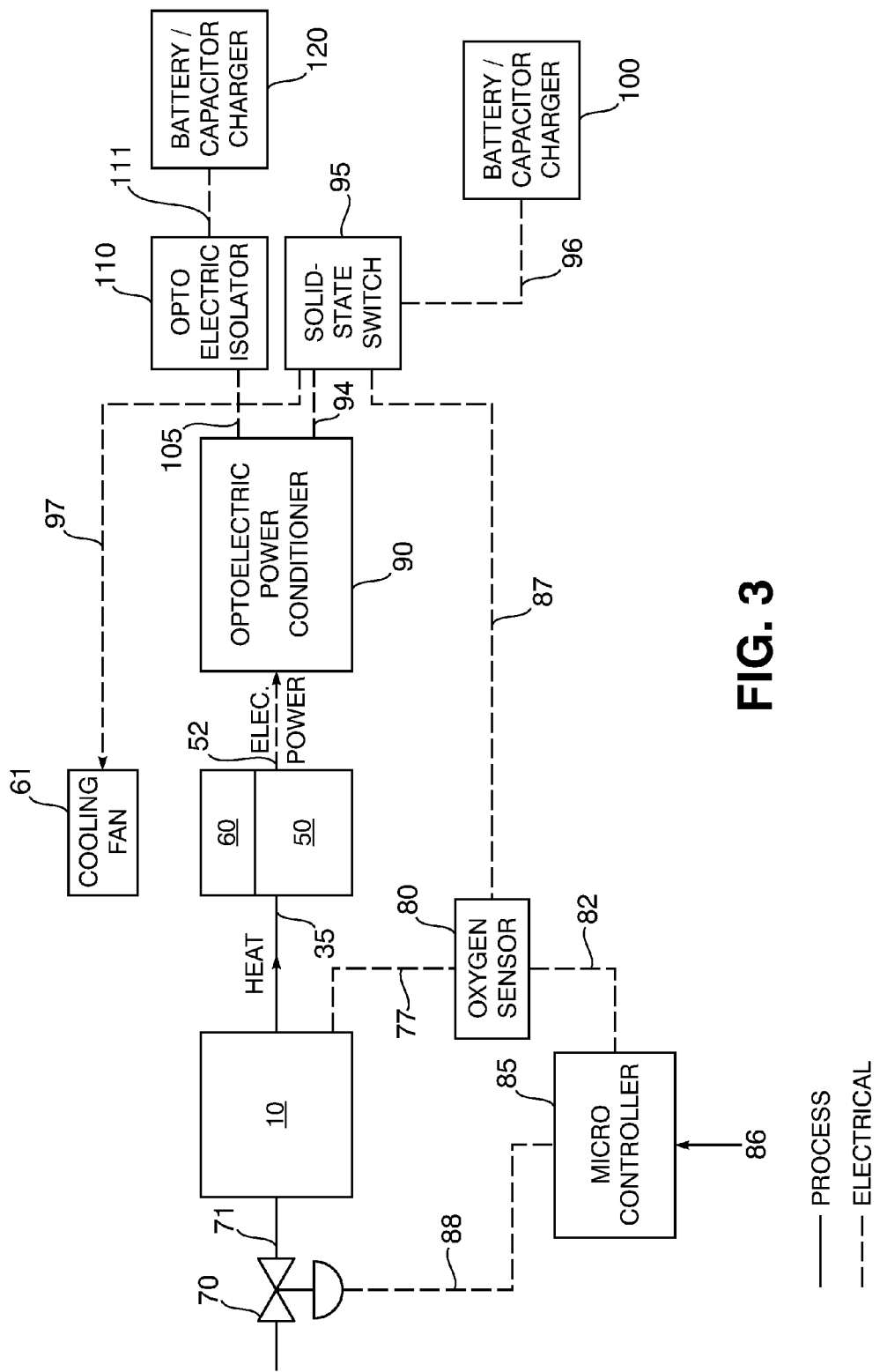
FIG. 3 is a schematic control diagram.

Preferred embodiments of the invention are described with respect to the figures wherein the reference numerals in the following written description correspond to like numbered elements in the figures.

FIG. 1 is a perspective view of a hot side heat exchanger. In the figure are heater core 10 and air flow controller 70. The general functional shape of heater core 10 is referred to as honeycomb. The honeycomb shape is defined with reference to axial direction line 12. Line 12 is a straight line extending from the inlet 44 to the outlet 14 of core 10. In this example, the length of core 10 from inlet 44 to outlet 14 is 120 millimeters (mm). The core has a 40 mm width and a 40 mm height. The honeycomb shaped core has a plurality of flow passages. A single flow passage identified as 16 extends from inlet 44 to outlet 14 and provides passage of air or other oxygen containing gas through heater core 10. Air flow line 71 to the right of FIG. 1 is co-axial with the axial direction line 12 to the left of FIG. 1.

In this example the 40 mm width and 40 mm height provides space for a plurality of 361 passages. That is a density of 225625 passages/meter$^2$ of cross-sectional area. In FIG. 1a, each passage has a square cross-section with a width of 1 mm and a height of 1 mm. That gives a total flow area of 361 millimeters$^2$ or 0.00361 meters$^2$. The length is the same as the length of the core, 120 mm. Each passage is axially straight as defined by axial direction line 12. In general, the length of the core ranges from 100 mm to 1000 mm. This provides a surface area of 400 mm$^2$ to 4000 mm$^2$. The size of the core is selected to produce the amount of power required for the application.

The shape of heater core 10 is generally rectangular and bounded by core exterior surface 30 consisting essentially of four flat surfaces. Heater core 10 may be cylindrical, in which case exterior surface 30 would be generally curved. The physical properties of the heater core are critical. During storage the heater core may be subjected to temperatures below 0° C. for extended periods of time. However in use, the core operating temperature is usually about 320° C. and may be 500° C. depending on power demand. A control set point setting or temperature excursion may cause that temperature to be exceeded. The core must provide a stable support over the temperature range of −50° C. to +1000° C. without structural deformation, cracking, spalling, losing surface area, or otherwise changing shape, composition or physical properties. Furthermore, the core must be stable to thermal cycling over this temperature range and to temperature excursions.

A group of materials have been identified which can be formed into the required honeycomb shape and surface area. In general these materials have been used for catalyst support. In particular, the materials are supports for carbon monoxide oxidation catalyst in an automobile catalytic converter. The catalytic converter treats the exhaust gas from automobiles and trucks. The materials are generally selected from the group consisting of silicon carbide (SiC), a silicon carbide/metallic silicon mixture, graphite, alumina ($Al_2O_3$), zirconia ($ZrO_2$), yttria ($Y_2O_3$) and cordierite. Silicon carbide (SiC) and graphite are preferred. Silicon carbide (SiC) is most preferred. Honeycomb supports made of these materials is commercially available either in the rectangular or cylindrical configuration. Based on performance and cost, The most preferred honeycomb material is silicon carbide (SiC). Silicon carbide (SiC) can be safely used up to a temperature of +1600° C. It is about one-third the weight of copper or steel and can be molded and manufactured in any shape and size. It is commercially available in many sizes and dimensions of the required honeycomb shape.

The silicon carbide (SiC) honeycomb support useful for the invention is commercially available. The silicon carbide (SiC) honeycomb has the following physical properties.

TABLE 1

Core bulk weight, 1 gram/cubic centimeter
Specific heat at 25° C., 750 J/Kg ° K.
Specific heat at 630° C., 750 J/Kg ° K.
Wall thickness, 0.4-0.8 millimeter
Expansion at 25° C., 4.20 × 10$^{-6}$
Expansion at 650° C., 3.90 × 10$^{-6}$
Decomposition temperature, >1800° C.
Surface Area, 600 meter$^2$/kg-1000 meter$^2$/kg It is also seen that the passages are defined by a horizontal partition wall 18 and a vertical partition wall 20. Passage 16a is shown to extend though heater core 10 and to be bounded by horizontal partition wall 18 and vertical partition wall 20. Of course, horizontal and vertical are relative to the general orientation of heater core 10. Each passage has an internal surface area defined by the horizontal partition wall and the vertical partition wall that bounds it. In this example, a single 120 mm long passage has a surface area of 480 millimeters$^2$. The core has 361 passages, providing a total internal surface area for the core of 173,280 millimeters$^2$ or 0.17328 meters$^2$.

The partition walls are coated with a pyrophoric solid fuel. The solid fuel ignites spontaneously on contact with air or other oxygen containing gas and burns to produce the heat for the generator to operate. The amount of air supplied to the pyrophoric solid fuel must be the amount necessary to achieve the required temperature differential across the thermoelectric device to provide the desired voltage. The operating temperature range is 320° C. to 500° C. Standard battery voltages are 1.5 volts, 3 volts, 6 volts, 9 volts and 12 volts.

The pyrophoric solid fuel may be any fuel that is safe and effective for this purpose. Generally the solid fuel is selected from the group consisting of magnesium alloys, aluminum alloys, zirconium alloys, iron oxides, iron and mixtures thereof. Examples include Magnalium (50/50 magnesium/aluminum), magnesium oxide, ferrous oxide, zinc oxide and copper oxide. The preferred pyrophoric solid fuels do not include heavy or toxic metals such as mercury, lead, arsenic chromium VI, selenium and the like.

Magnesium (Mg) and magnesium oxide (MgO) are preferred. The oxidation of magnesium is described by the reaction:

$$2Mg(s)+O_2(g) \rightarrow 2MgO(s)+\text{heat}$$

Another preferred solid fuel is red oxide ($Fe_2O_3$) which is particularly useful in combination with a silicon (Si) binder. The reaction is described as follows:

$$2Fe_2O_3+3Si \rightarrow 3SiO_2+4Fe$$

$\Delta H = -552.96$ cal/gram
$\Delta G = -552.47$ cal/gram $$2Fe_2O_3+Si \rightarrow SiO_2+4FeO$$

$\Delta H = -193.4$ cal/gram
$\Delta G = -206.64$ cal/gram

The pyrophoric solid fuel is reduced to a size so that it can be applied as a uniform coating on the inner surfaces of the solid support. For this purpose, it is recommended that the solid fuel be reduced to a particle size of about 10 to 1000 nano-meter (nm). It was found experimentally that a particle size of 12 to 15 nano-meter (nm) worked well in the above-described core. The particle size provides for the coating of the partition walls, without blocking the flow of air through the passages. The generator is not controllable if the flow area is blocked. Also particles of this size can be suspended uniformly in an organic binder for uniformity of application.

The solid fuel is applied in a uniform particle size and a uniform thickness on the surface so that hot spots in the core do not develop. Hot spots are undesirable because they cause temperature fluctuations that must be controlled by reducing air flow. From a control perspective, temperature fluctuations are unsteady state and detrimental to producing uninterrupted electric power. The solid fuel is adhered to the honeycomb support by means of a binder. The binder provides the adhesion between the solid fuel and the honeycomb support. The binder also facilitates applying the solid fuel uniformly, in the sense of heat generation, over the partition walls. And in the case of silicon (Si), the binder also contributes to the oxidation reaction. The solid fuel may be applied as a gel or paste.

Suitable oxygen porous organic binders include polyethylene, polypropylene, polystyrene, polymethyl methacrylate, polyvinyl chloride, polyvinylidene fluoride, polyvinyl fluoride, polyvinylidene chloride, polychlorotrifluoroethylene, polyethylene terephthalate, polyvinyl acetate, an ethylene/vinyl ester copolymer, polychloroprene, polyisoprene, polyurethane, polyester, polycarbonate, polyamide, polyether, butyl rubber, silicone-based polymer, or formaldehyde- or butyraldehyde-based vinyl polymer. Polyethylene, polypropylene and polystyrene are preferred. Colloidal silica is also preferred because it can be combined with the fuel to form a uniform gel.

Mating surface 22 is shown in the drawing. Mating surface in the drawing is both a horizontal surface and a vertical surface. The orientation is due to the square cross sectional dimension of heater core 10. If heater core were cylindrical in shape, mating surface 22 could, though not necessarily, be circular. Likewise, mating surface 46 is provided. During storage, the fit between mating surfaces 22 and 46 and any cap (not shown) must be air tight in order to prevent intrusion of air into any passage 16 and to maintain shelf life. With the caps (not shown) in place, the shelf life of the generator is greater than that of a battery. However, the exothermic reaction that takes place in heater core 10 is self initiating once oxygen is introduced. Absent a cap, heater core 10 is in the power generating configuration without any further action.

The drawing shows two core exterior surfaces 30 with six rectangular indentations defined by side wall 34 and thermoelectric device mating surface 36. Out of view are six more rectangular indentations for a total of twelve on core 10. In the cross-section seen in FIG. 2, the thermoelectric device is pressed into the sides of heater core 10 to provide for heat transfer from the heater core 10 to the thermoelectric device. Means (not shown) may be provided to press the thermoelectric device 50 against the mating surface. The mating surface provides for intimate contact facilitating heat transfer between heater core 10 and a thermoelectric device. This space is slightly larger than the dimensions of the thermoelectric device so that a small space is left between side wall 34 and thermoelectric device 50 to allow for thermal expansion. Cold side heat exchanger 60 is shown in contact with thermoelectric device 50.

Heat transfer may be enhanced by providing a thin coating (not shown) of thermal interface material on mating surface 36 to reduce the resistance to heat transfer. Examples of thermal interface material include, silver, palladium, gold, carbon nanotubes and equivalent functioning materials. A thermoelectric device coated for this purpose with graphite in a polymer binder is commercially available.

Electrical contact points 52 provide for withdrawing electric power from thermoelectric device 50. Electrical contact points 52 are symbolic of wires for withdrawing electricity produced by the device.

The thermoelectric device is selected from any of the devices that are sold commercially for this purpose. A preferred thermoelectric device is referred to as a quantum well thermoelectric device. In general a quantum well thermoelectric device includes alternating p-type and n-type semiconductor elements arranged in series. The junction is typically made of doped bismuth telluride. The p-type elements are heavily doped to create and excess of electrons. The n-type elements are heavily doped to create a deficiency of electrons. Since each element of a semiconductor thermoelectric device produces only a few millivolts, the elements are arranged in series of alternating elements to increase the output. Arrays are assembled with large numbers of elements arranged in a checkerboard pattern in order to achieve useful, standard battery voltages.

U.S. Pat. No. 5,436,467 to N. B. Elsner et al. teaches a Superlattice Quantum Well Thermoelectric material. The patent is incorporated herein by reference as an example of a quantum well. Two other thermoelectric devices taught by way of example are incorporated herein by reference. U.S. Pat. No. 5,892,656 teaches a Thermoelectric Generator to J. C. Bass. U.S. Pat. No. 5,625,245 for a Thermoelectric Generator for Motor Vehicle to J. C. Bass teaches a thermoelectric device having dimensions of 2.1 inches by 2.1 inches by 0.2 inches. A differential temperature of 400° F. between a hot side heat exchanger and a cold side heat exchanger will produce 13 Watts at 1.55 volts.

Cold side heat exchanger 60 is a heat sink in contact with thermoelectric device 50. Suitable heat sinks are commercially available. In general, a heat sink has a metallic heat transfer surface in contact with a flowing heat transfer medium. In one alternative, an electrically driven fan drives cooled air against an aluminum heat exchange surface. In another alternative, water cooled aluminum block can be used. Heat sink technology is well known. Alternatives are commercially available and can be selection without unusual difficulty.

In FIG. 3, air flow control valve 70 provides flow regulation of air or other oxygen containing gas through air flow line 71 to the core 10. Line 77 passes a sample of off-gas from core 10 to sensor 80. Sensor 80 senses any relevant physical parameter including oxygen composition, carbon oxides composition and temperature. In this example, sensor 80 is an oxygen sensor. Oxygen sensor 80 measures the amount of oxygen in the sample of off-gas and sends signal 82 proportional thereto to micro controller 85. Micro controller 85 receives the signal from oxygen sensor 80 indicative of oxygen content and compares that value with a set point value 86. Micro controller 85 then sends signal 88 to control valve 70 that is proportional to the difference between the measured oxygen content and the set point oxygen content. This feedback control loop regulates the heat flow 35 from core 10 to thermoelectric device 50.

Thermoelectric device 50 produces electricity based on the temperature difference between the temperature of the heat 35 and the temperature of cold side heat exchanger 60. Cold side heat exchanger 60 is a heat sink. Heat sink 60 includes cooling fan 61 which regulates the flow of air. In this capacity, cooling fan 61 includes a heat transfer medium flow regulator.

Electric power is withdrawn from thermoelectric device via contact point and wire 52. The electric power is passed to opto-electric power conditioner 90. Opto-electric power conditioner 90 includes a voltage regulator and a switch. The function of the voltage regulator is control and adjustment of the voltage between low voltage power, in the range of 1.5 volts to 12 volts, typically 6 volts to 12 volts and high voltage power in the range of 12 volts to 500 volts. Opto-electric power conditioner 90 sends electric power to low voltage load 100 and optionally to high voltage load 120. Low voltage power is passed from opto-electric power conditioner 90 via line 94 to solid state switch 95. Solid state switch 95 provides power via line 97 to operate cooling fan 61 and via line 87 to operate oxygen sensor 80. The remaining low voltage power is provided via line 96 to low voltage load 100. Low voltage load 100 is a battery, capacitor, charger or any other low voltage power load or demand.

Opto-electric power conditioner 90 provides high voltage power if it is available from thermoelectric module 50. High voltage power is passed via line 105 to opto-electric isolator 110. Opto-electric isolator 110 provides power via line 111 to high voltage load 120. Opto-electric isolator 110 functions to allow the transmission of power at a selected voltage and to prevent transmission of over-voltage power. High voltage load 120 is a battery, capacitor, charger or any other high voltage power load or demand.

Inventor contemplates that opto-electric power conditioner 90, opto-electric isolator 110, solid state switch 95, oxygen sensor 82 and micro-controller 86 will all be assembled on a single chip and the chip mounted on core 10 with thermoelectric device 50 and cold side heat exchanger 60.

Not shown in the drawing are the several types of containers used to hold core 10. The generator produces electricity spontaneously on contact with air. Accordingly, the only exposure of the generator with air or other oxygen containing gas is by way of air flow controller 70. This necessitates that when the generator is not in use, it be kept in an air tight canister. In addition to the canister, end caps may be applied to mating surface 22 and mating surface 46. When in use, the generator is put in position so that contact points 52 are connected to an electric power consumer. Examples of an electric power consumer are the electric system of a motor vehicle, electronic equipment such as radios, telephones and computers and electric lights.

Figure 4:
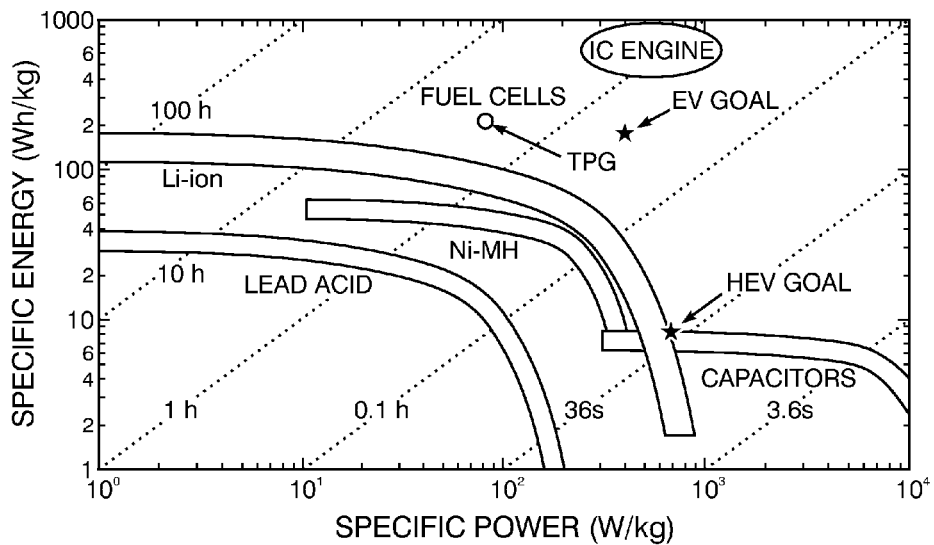
FIG. 4 is a graphical representation of specific performance with respect to time for a number of power generators.

Reference is made to FIG. 4 which shows the specific energy in watt hours per kilogram (Wh/kg) versus specific power in watts per kilogram (W/kg) and with respect to time for the thermoelectric generator of the invention compared with conventional electric power sources. Time is plotted in seconds (s) and in hours (h). The performance bands of operation are plotted for the following power sources.

TABLE 2

TPG - Thermoelectric generator of the invention.
Li-ion - lithium ion battery.
Lead-acid - lead acid battery.
Ni-MH - nickel metal hydride battery.
Fuel Cells
Capacitors
IC Engine - internal combustion engine generator.
EV goal - Goal for an electric vehicle battery.
HEV goal - Goal for a hybrid electric vehicle battery.

As seen in FIG. 4, the thermoelectric generator of the invention produces electric power consistent with the performance of a fuel cell.

In a second embodiment, heat to the core is supplied by burning an available hydrocarbon fuel. A hydrocarbon fuel burner is positioned proximate partition walls of heater core 10. A fuel flow regulator controls the flow of fuel to the hydrocarbon fuel burner. With excess oxygen, flame temperature depends on the fuel value of the hydrocarbon fuel supplied to the burner. Fuel gases include hydrogen and hydrocarbon fuel gases including methane, acetylene, propane, butane, natural gas and mixtures thereof. Liquid hydrocarbon fuels include gasoline, diesel, kerosene, jet fuel and mixtures thereof. The liquid hydrocarbon fuels are first vaporized and passed to the fuel burner.

The fuel may be any gaseous or liquid hydrocarbon fuel that is safe and effective for this purpose. The theoretical potential for producing electricity of these hydrocarbon fuel gases is expressed by the adiabatic flame temperature.

TABLE 3

Adiabatic Flame Temperature

| Hydrogen in air | 2055° C. |
| Methane in air | 1950° C. |
| Acetylene in air | 2550° C. |
| Acetylene in oxygen | 3100° C. or greater |
| Propane in air | 1995° C. |

TABLE 3-continued

Adiabatic Flame Temperature

| Propane in oxygen | 2800° C. |
| Butane in air | 1970° C. |

Adiabatic flame temperature is a physical property of the hydrocarbon. However, the burner is not operated under adiabatic conditions and the adiabatic flame temperature is not achieved. In fact, the core temperature typically operates at temperatures below 1000° C. Another indicator of electricity producing potential is the combustion value of a fuel.

TABLE 4

Combustion Values

| Methane | 950 to 1150 Btu/ft$^3$ |
| Propane | 2574 Btu/ft$^3$ |
| Butane | 3225 Btu/ft$^3$ |

In this second embodiment, the core is not heated by pyrophoric fuel. Accordingly, it is not necessary to store the core in an air tight container. The hydrocarbon fuel must be ignited to begin the production of power.

The invention is shown by way of example.

EXAMPLE

In the laboratory, a heater core 10 was positioned on a stand so that axial direction line 12 was vertical. The heater core like that described in FIG. 1 was heated from below with a Bunsen burner. Laboratory gas was the sole fuel source. Combustion of laboratory gas produced a clear blue flame immediately below the heater core. The flame was close enough to the bottom of heater core 10 so that combustion gas passed through the heater core.

Figure 5:
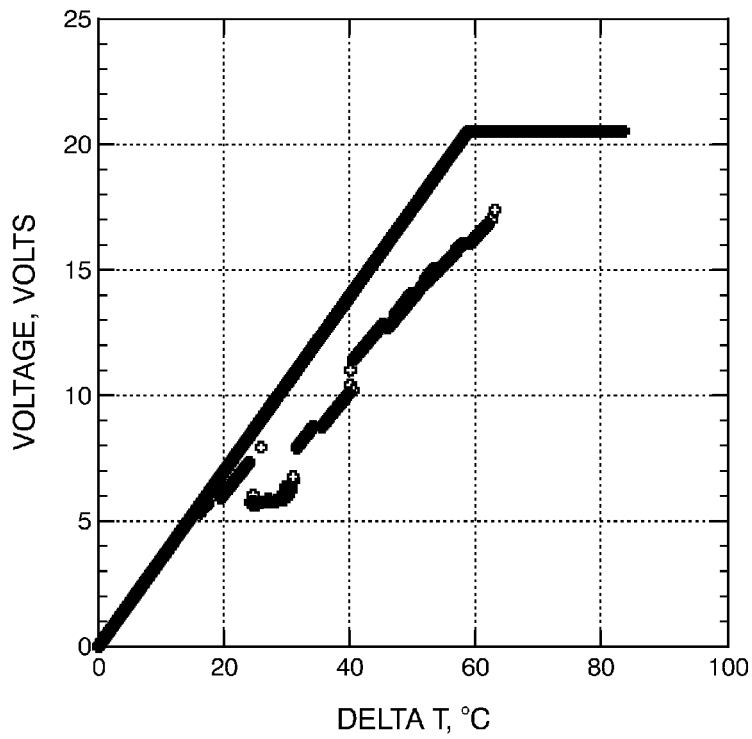
FIG. 5 is graph of voltage versus temperature. difference.
Figure 6:
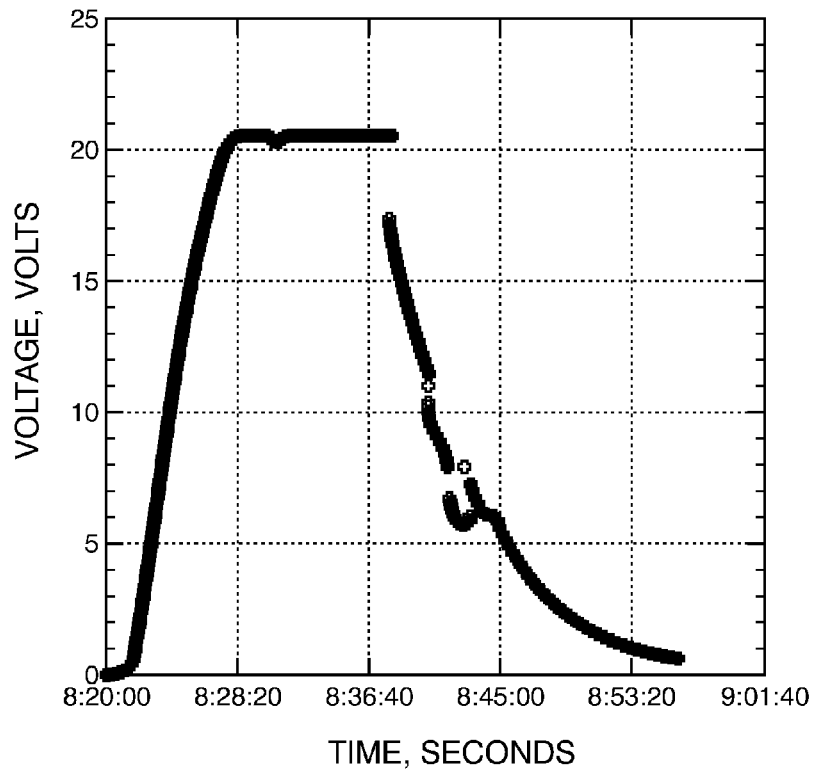
FIG. 6 is graph of voltage versus time.

The bench demonstration was instrumented with a digital computer that recorded temperature of the cold side heat exchanger, temperature of the hot side heat exchanger, voltage output and time. FIG. 5 is a plot of the recorded data. In FIG. 5, thermoelectric voltage in volts is plotted against the temperature difference (Delta T) in degrees Centigrade (° C.). FIG. 6 reports thermoelectric voltage versus time.

Figure 7:
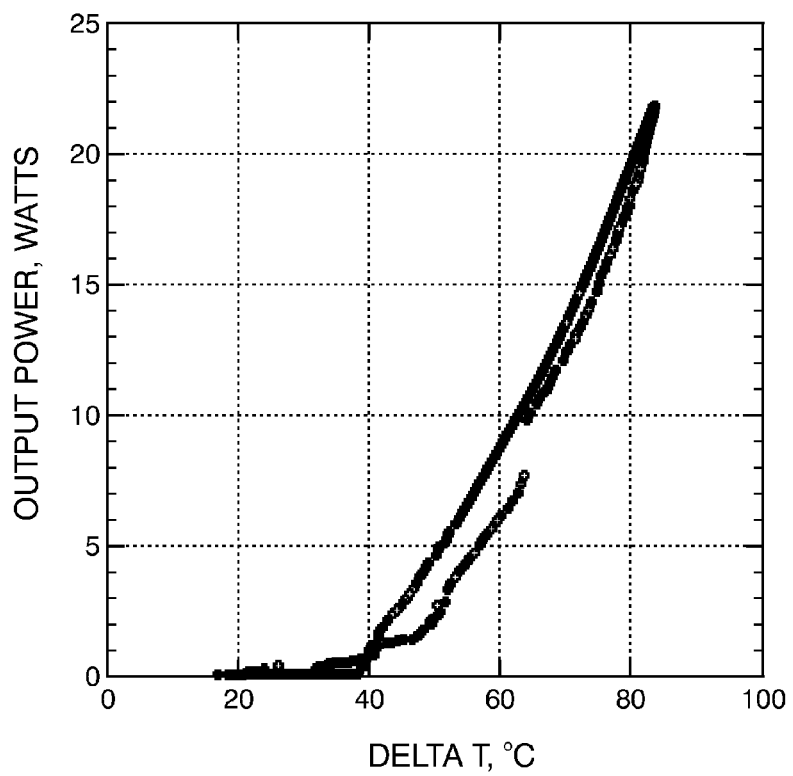
FIG. 7 is a graph of output power versus temperature difference.

FIG. 7 is a plot of output power verses temperature difference for the same data. In all three figures of Example 1, extraneous data is attributed to electrical noise in the data acquisition system and other artifacts of the laboratory apparatus.

The foregoing discussion discloses and describes embodiments of the invention by way of example. One skilled in the art will readily recognize from this discussion, that various changes, modifications and variations can be made therein without departing from the spirit and scope of the invention as defined in the following claims.

What is claimed is:
1. A thermoelectric generator comprising:
(1.) a hot side heat exchanger comprising: a silicon carbide (SiC) honeycomb support having a plurality of passages aligned in an axial direction which are defined by partition walls, the partition walls coated with a pyrophoric solid fuel;
(2.) a cold side heat exchanger;
(3.) a thermoelectric device between the hot side heat exchanger and the cold side heat exchanger, providing an electric current at a voltage; and

(4.) an opto-electric power conditioner including:
   (a.) a voltage regulator including a control circuit operational: (i.) to measure the voltage and to produce a voltage measurement therefrom, (ii.) to compare the voltage measurement with a set point voltage in the range of 12 volts and 500 volts and (iii.) to operate a switch based on the difference between the voltage measurement and the set point voltage, the switch operative: to pass electric current at or above the set point voltage to a high voltage load, and to pass at least a portion of the electric current to a low voltage load at a voltage up to 12 volts,
   (b.) an opto-electric isolator operational to isolate the control circuit from the electric current.

2. The thermoelectric generator of claim 1 wherein the pyrophoric solid fuel is selected from the group consisting of magnesium alloys, aluminum alloys, zirconium alloys, iron, iron oxides and mixtures thereof.

3. The thermoelectric generator of claim 1 wherein the pyrophoric solid fuel is selected from the group consisting of magnesium (Mg) and magnesium oxide (MgO).

4. The thermoelectric generator of claim 1 wherein the pyrophoric solid fuel is an iron oxide with a silicon (Si) binder.

5. A thermoelectric generator comprising:
(1.) a hot side heat exchanger comprising: a silicon carbide (SiC) heater core having a plurality of flow passages defined by partition walls aligned in an axial direction, a hydrocarbon fuel burner and a hydrocarbon fuel flow regulator;
(2.) a cold side heat exchanger;
(3.) a thermoelectric device between the hot side heat exchanger and the cold side heat exchanger, providing an electric current at a voltage; and
(4.) an opto-electric power conditioner including:
   (a.) a voltage regulator including a control circuit operational: (i.) to measure the voltage and to produce a voltage measurement therefrom, (ii.) to compare the voltage measurement with a set point voltage in the range of 12 volts and 500 volts and (iii.) to operate a switch based on the difference between the voltage measurement and the set point voltage, the switch operative: to pass electric current at or above the set point voltage to a high voltage load, and to pass at least a portion of the electric current to a low voltage load at a voltage up to 12 volts,
   (b.) an opto-electric isolator operational to isolate the control circuit from the electric current.

6. The thermoelectric generator of claim 5 wherein the fuel is selected from the group of gases consisting of hydrogen, methane, acetylene, propane, butane, natural gas and mixtures thereof.

7. The thermoelectric generator of claim 5 wherein the fuel is selected from the group of liquids consisting of gasoline, diesel, heating oil, kerosene and jet fuel.

8. A thermoelectric generator comprising:
(1.) a hot side heat exchanger including:
   a silicon carbide (SiC) honeycomb support having a plurality of passages defined by partition walls aligned in an axial direction,
   a pyrophoric solid fuel coating the partition walls and a control valve providing oxygen-containing gas to the pyrophoric fuel;
(2.) a cold side heat exchanger including: a heat transfer medium flow regulator;
(3.) a thermoelectric device between the hot side heat exchanger and the cold side heat exchanger, providing an electric current at a voltage; and
(4.) an opto-electric power conditioner including:
   (a.) a voltage regulator including a control circuit operational: (i.) to measure the voltage and to produce a voltage measurement therefrom, (ii.) to compare the voltage measurement with a set point voltage in the range of 12 volts and 500 volts and (iii.) to operate a switch based on the difference between the voltage measurement and the set point voltage, the switch operative: to pass electric current at or above the set point voltage to a high voltage load, and to pass at least a portion of the electric current to a low voltage load at a voltage up to 12 volts,
   (b.) an opto-electric isolator operational to isolate the control circuit from the electric current.

9. The thermoelectric generator of claim 8 wherein the high voltage load is selected from the group consisting of a chargeable battery, a capacitor and a charger.

10. The thermoelectric generator of claim 8 wherein the low voltage load is selected from the group consisting of a chargeable battery, a capacitor and a charger.

11. The thermoelectric generator of claim 8 including an oxygen analyzer.

12. The thermoelectric generator of claim 8 wherein the low voltage load includes a control valve controller, an oxygen analyzer and the heat transfer medium flow regulator.

\* \* \* \* \*